United States Patent [19]
Narui et al.

[11] 3,935,334
[45] Jan. 27, 1976

[54] PROCESS FOR PREPARING A METALLIZED RESIN FILM FOR CONDENSER ELEMENT

[75] Inventors: Hiroshi Narui, Uji; Terumi Shinohara, Joyo, both of Japan

[73] Assignee: Oike & Company, Ltd., Kyoto, Japan

[22] Filed: June 21, 1974

[21] Appl. No.: 481,916

[30] Foreign Application Priority Data
June 6, 1973    Japan.............................. 48-72675
Dec. 3, 1973    Japan.............................. 48-13828
June 1, 1974    Japan.............................. 49-62397

[52] U.S. Cl. .................... 427/81; 427/99; 427/282; 427/272; 427/102; 427/259
[51] Int. Cl.² ...................... B05D 5/12; B05D 5/00
[58] Field of Search ....... 117/212, 38, 43, 227, 107, 117/119, 5.5, 8.5; 427/282, 272, 124, 102, 91

[56] References Cited
OTHER PUBLICATIONS
Droper, CR, Printed Circuits and Electronic Assemblies, Robt. Droper Ltd. TK 7872.P65 D7 (1969) pp. 54–55.

*Primary Examiner*—John D. Welsh
*Attorney, Agent, or Firm*—Armstrong, Nikaido & Wegner

[57] ABSTRACT

A process for providing a margin in a metallized resin film for a condenser element which is characterized by providing on a dielectric resinous layer a water-soluble coating layer having a pattern corresponding to a margin pattern, providing a metal deposition layer on the resinous layer including a coated part and a non-coated part and removing the water-soluble coating layer and the metal deposition layer thereon by washing with water. According to the process, a metallized resin film having an arbitrary margin pattern and a superior electrical property can be readily obtained, with completely eliminating any complexity of the procedure and disadvantage in conventional processes for providing a margin.

18 Claims, 30 Drawing Figures

PROCESS FOR PREPARING A METALLIZED RESIN FILM FOR CONDENSER ELEMENT

BACKGROUND OF THE INVENTION

The present invention relates to a process for preparing a metallized resin film suitable for a condenser element, particularly to a novel process for providing a margin in a metallized resin film for a condenser element.

As one of common condenser elements, there has been known a metallized resin film which consists of a resinous layer as dielectric and a metal deposition layer provided on the resinous layer as an electrode. Such a metallized resin film has been prepared by the following two methods: one method directs to a process for preparing a metallized resin film of which thickness is comparatively large, for instance, about more than 4 $\mu$, which is characterized by depositing a metal on a preformed resin film such as polyethyleneterephthalate film. Other method directs to a process for preparing a metallized resin film of which thickness is comparatively small, for instance, about less than 4 $\mu$, which is characterized by depositing a metal on a resinous coating layer provided on a base film by coating method and then peeling off the metal deposition layer and resinous coating layer out of the base film.

On the other hand, as processes for providing a margin (which means a part where a metal deposition layer is not present on a resinous layer, for instance, an ear part of a metallized resin film) in a metallized resin film, there have been adopted tape-masking method, oil-masking method and electric-discharging method. In the tape-masking method, the margin is formed by masking the surface of a dielectric resinous layer with a film or tape in the portion of the resinous layer corresponding to a marginal pattern, depositing a metal on the whole surface of the dielectric resinous layer partially coated with the film or tape and peeling off the film or tape. In the oil-masking method, the margin is formed by coating an oil on a dielectric resinous layer in the portion of the resinous layer corresponding to a marginal pattern and depositing a metal on the dielectric resin film partially coated with the oil (in that case, the metal is not deposited to the part coated with the oil). In the electric-discharging method, the margin is formed by depositing a metal on the whole surface of a dielectric resinous layer and partially eliminating the metal deposited in the portion corresponding to a marginal pattern by means of electric-discharging.

However, the tape-masking method and oil-masking method have various disadvantages such as the complexity in the procedure of masking the surface of a dielectric resinous layer with a film or tape, or an oil so that only a part of the surface of the dielectric resinous layer to be a margin later is covered and other part of the surface of the dielectric resinous layer is not covered, and the unevenness of the metal deposition layer on a boundary line between a marginal part and a metal deposition part which is hereinafter referred to as "margin edge", which results from the peeling of metal deposition layer on the margin edge and the ununiform deposition of metal on margin edge. The oil-masking method has a further disadvantage of the lowering in a electrical property of the metallized resin film due to a oil margin.

Further, such conventional methods for forming a margin has a common disadvantage that a margin can be formed only in the longitudinal direction of the film and can not be formed in the transverse direction of the film. In the tape-masking method and oil-masking method, generally, a tape or oil for masking a dielectric resinous layer is continuously applied to the dielectric resinous layer with running the dielectric resinous layer at a constant speed. On the other hand, in the electric-discharging method, the deposited metal on the dielectric resinous layer by electric-discharging is continuously eliminated with running the metallized dielectric resinous layer at a constant speed. In that case, it is possible to form a margin only in the longitudinal direction of the film but it is impossible to form a margin in the transverse direction of the film and further a margin having an arbitrary pattern. If it is tried to obtain at any cost a metallized resin film having a margin consisting of a margin in the longitudinal direction thereof and a margin in the transverse direction thereof by conventional methods, it would be necessary to stop the running of the film in the longitudinal direction thereof during the operation of masking the film with a tape or oil in the transverse direction thereof, or of eliminating the metal deposition layer on the film in the transverse direction thereof by electric-discharging. However, such a procedure is much tedious and therefore the operating efficiency is remarkably reduced. Thus, in conventional metallized resin films, the marginal pattern thereof was restricted to only that formed in the longitudinal direction of the film.

OBJECTS OF THE INVENTION

An object of the present invention is to provide a process for preparing a metallized resin film for condenser element by which a margin can be readily formed.

Another object of the invention is to provide a process for preparing a metallized resin film of which margin has a sharp edge.

Further object of the invention is to provide a process for preparing a metallized resin film having an excellent electrical property.

Still further object of the invention is to provide a process for preparing a metallized resin film having a arbitrary marginal pattern.

Still more further object of the invention is to provide a process for preparing a metallized resin film suitable for automatic manufacture of a condenser.

These and other objects of the invention will become apparent from the description hereinafter.

BRIEF DESCRIPTION OF THE DRAWING

FIG. 1 (A) shows a fragmentary top plan view of a metallized resin film having only a zonal margin in the longitudinal direction thereof, FIG. 1 (B) shows a transverse sectional view taken along line A—A of FIG. 1 (A), FIG. 2 (A) shows a fragmentary top plan view of a metallized resin film which has a zonal margin in the longitudinal direction thereof having therein discontinuous metal deposition parts, FIG. 2 (B) shows a transverse sectional view taken along line A—A of FIG. 2 (A), FIG. 3 (A) shows a fragmentary top plan view of a metallized resin film having discontinuous margins in a continuous metal deposition part, FIG. 3 (B) shows a transverse sectional view taken along line A—A of FIG. 3 (A), FIG. 4 (A) shows a fragmentary top plan view of a metallized resin film having zonal margins in the transverse direction thereof, FIG. 4 (B) shows a transverse sectional view taken along line A—A of FIG. 4 (A), FIG. 5 (A), FIG. 5 (B) and FIG. 5 (C) show transverse sectional views illustrating an embodiment of the process for preparing the metallized resin film shown in FIG. 1 (A) and FIG. 1 (B), FIG. 6 (A), FIG. 6 (B), FIG. 6 (C), FIG. 6 (D) and FIG. 6 (E) show transverse sectional views illustrating an embodiment of the process for preparing the metallized resin film shown in FIG. 1 (A) and FIG. 1 (B), FIG. 7, FIG. 8, FIG. 9 and FIG. 10, respectively, show an embodiment of a dipolar metallized resin film, FIG. 11 (A), FIG. 11 (B), FIG. 11 (C), FIG. 11 (D) and FIG. 11 (E) show transverse sectional views illustrating an embodiment of the process for preparing the metallized resin film shown in FIG. 9, and FIG. 12 (A), FIG. 12 (B), FIG. 12 (C), FIG. 12 (D) and FIG. 12 (E) show transverse sectional views illustrating another embodiment of the process for preparing the metallized resin film shown in FIG. 1 (A) and FIG. 1 (B).

DETAILED DESCRIPTION OF THE INVENTION

It has now been found that the above-mentioned objects are readily accomplished by forming a margin in a metallized resin film according to a process comprising the following steps of:

providing a water-soluble coating layer by applying a water-soluble paint on a dielectric resinous layer in the portion of the surface of the dielectric resinous layer corresponding to a margin pattern, completely covering the dielectric resinous layer including a coated part and a non-coated part with a metal deposition layer, and removing the water-soluble coating layer and the metal deposition layer thereon by dissolving away the water-soluble coating layer with water.

In the present invention, a metallized resin film is prepared by the following either process, depending upon a kind of the dielectric resinous layer. In case the resinous layer is a preformed self-supporting resin film, a metallized resin film is prepared by a process comprising the following steps of:

providing a water-soluble coating layer by applying a water-soluble paint at least on one side of a selfsupporting dielectric resin film in the portion of the film corresponding to a marginal pattern, completely covering the dielectric resin film including a coated part and non-coated part with a metal deposition layer, and removing the water-soluble coating layer and the metal deposition layer thereon by dissolving away the water-soluble coating layer with water. In case the resinous layer is a resinous coating prepared by a coating method, a metallized resin film is prepared by a process comprising the following steps of:

providing a dielectric resinous coating on a self-supporting base film by a coating method, providing a water-soluble coating layer by applying a water-soluble paint on the dielectric resinous coating in the portion of the resinous coating corresponding to a marginal pattern, completely covering the dielectric resinous coating including a coated part and non-coated part with a metal deposition layer, removing the water-soluble coating layer and the metal deposition layer thereon by dissolving away the water-soluble coating layer with water, and removing the metallized resinous coating obtained from the base film. The former process is hereinafter referred to as "Process A" and the latter process as "Process B".

The above-mentioned Process A directs to a process for preparing a metallized resin film having a thickness of more than about 1.5 $\mu$ and the above-mentioned Process B directs to a process for preparing a metallized resin film having a thickness of less than about 4 $\mu$. According to Process B, a metallized resin film having a extremely thin thickness, for instance, about 0.5 $\mu$ can be readily prepared because a metallized resin film on the way of preparation is always supported by a base film having a sufficient mechanical strength.

According to the process of the present invention, various disadvantages associated with conventional processes for forming a margin such as the tediousness of masking or covering a dielectric resinous layer (dielectric resin film or dielectric resinous coating) in the portion of the resinous layer corresponding to a marginal pattern, the peeling of the metal deposition layer on the margin edge and the lowering in the electrical property of a metallized resin film due to an oil vapor, can be completely eliminated.

In the process of the present invention, an excess of the metal deposition layer is eliminated by dissolving away the water-soluble coating layer with water. Accordingly, there is no danger that chemicals are involved in the metallized resin film so that there is no trouble caused by chemicals involved in the metallized resin film in case of employing it as a condenser element. Further, such a water treatment does not restrict the process of the present invention to a particular kind of resin film employed. Furthermore, the water treatment can give a margin having a sharp edge.

As described above, according to the process of the present invention, a metallized resin film having a superior mechanical property and electrical property can be much readily prepared.

Figures 1A, 1B:
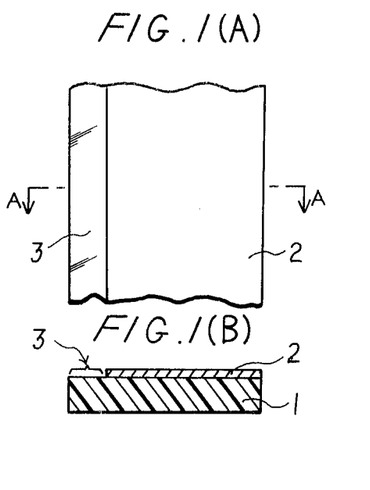

The further remarkable advantage of the process of the present invention is that it is possible to arbitrarily alter the pattern of a margin. As described above, in conventional processes, the pattern of a margin is restricted to that directed only in the longitudinal direction of the film, as shown in FIG. 1 (A) and FIG. 1 (B). FIG. 1 (A) is a fragmentary top plan view of a metallized resin film prepared by conventional process and FIG. 1 (B) is a transverse sectional view taken along line A-A of FIG. 1 (A). In FIG. 1 (A) and FIG. 1 (B), 1 is a dielectric resinous layer, 2 is a metal deposition layer which becomes an electrode of condenser and 3 is a margin of which pattern is restricted to that directed in the longitudinal direction of the film. Such a margin as shown in FIG. 1 (A) and FIG. 1 (B) is hereinafter referred to as "a Zonal margin in the longitudinal direction of the film". Otherwise, such a metal deposition layer as shown in FIG. 1 (A) and FIG. 1 (B) is hereinafter referred to as "a continuous metal deposition part in the longitudinal direction of the film". However, according to the process of the present invention for forming a margin by a process which comprises providing a water-soluble coating layer having a pattern corresponding to that of a margin on a dielectric resin film (or a dielectric resinous coating) by applying a water-soluble paint, providing a metal deposition layer on the dielectric resin film including a coated part and non-coated part and removing the water-soluble coating layer and the metal deposition layer thereon by dissolving away the water-soluble coating layer with water, the pattern of a margin is not restricted to that directed in the longitudinal direction of the film but a margin of which pattern is not only in the transverse direction of the film but also arbitrary can be readily formed. Examples of the margin formed by the process of the present invention are as follows:

1. Zonal margin in the longitudinal direction having therein discontinuous metal deposition parts which are aligned in the longitudinal direction of the film with a separation of a desired distance.
2. Discontinuous margins in a continuous metal deposition part, which are aligned in the longitudinal direction of the film with a separation of a desired distance.
3. Zonal margins in the transverse direction of the film which are aligned in the longitudinal direction of the film with a separation of a desired distance.

Figures 2A, 2B:
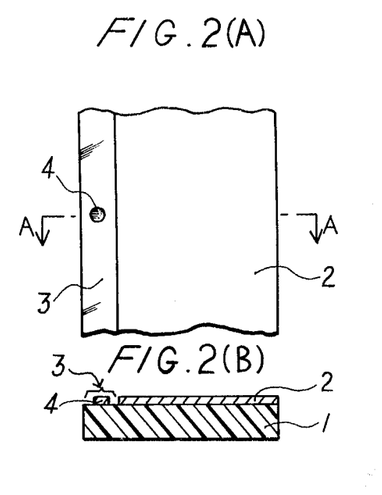
Figures 3A, 3B:
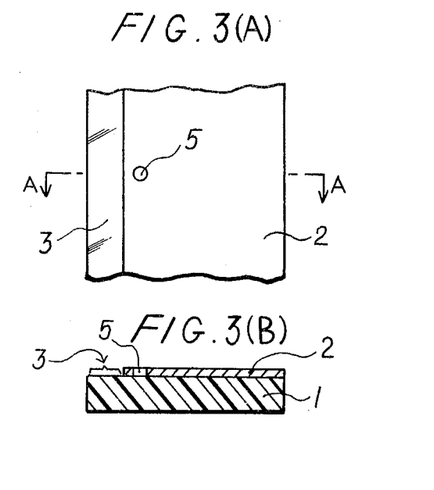

In FIG. 2 (A) and FIG. 2 (B), there is shown an embodiment of the metallized resin film which has a zonal margin in the longitudinal direction having therein discontinuous metal deposition parts. FIG. 2 (A) is a fragmentary top plan view of the film and FIG. 2 (B) is a transverse sectional view taken along line A—A of FIG. 2 (A). In FIG. 2 (A) and FIG. 2 (B), 1, 2 and 3 are the same as in FIG. 1 (A) and FIG. 1 (B), and 4 are discontinuous metal deposition parts having a circular shape, which are aligned in the zonal margin 3 in the longitudinal direction thereof with a constant separation. In FIG. 3 (A) and FIG. 3 (B), there is an embodiment of the metallized resin film having discontinuous margins in a continuous metal deposition part. FIG. 3 (A) is a fragmentary top plan view of the film and FIG. 3 (B) is a transverse sectional view taken along line A—A of FIG. 3 (A). In FIG. 3 (A) and FIG. 3 (B), 1, 2 and 3 are the same as in FIG. 1 (A) and FIG. 1 (B), and 5 are discontinuous margins having a circular shape which are aligned in the continuous metal deposition part 2 in the longitudinal direction thereof with a constant separation. When the separation between ajacent discontinuous metal deposition parts or between adjacent discontinuous margins is taken as the distance corresponding to a desired capacity, the metallized resin film can be automatically cut, after a desired length of the film is wound, by detecting the position of the discontinuous metal deposition part or of the discontinuous margin by means of an appropriate detecting device such as a photoelectric device and feeding the output of the detecting device to an appropriate cutting device. As a result, the operation of winding a metallized resin film to make it into condenser can be carried out with a extremely high efficiency and the scatter among the capacities of the condensers obtained is greatly reduced in comparison with a conventional method employing a conventional metallized resin film having only zonal margin in the longitudinal direction of the film as shown in FIG. 1 (A) and FIG. 1 (B), in which the metallized resin film is manually cut with measuring the length of the metallized resin film to be wound by means of a tape meter.

The shape of the discontinuous metal deposition part in a zonal margin or of the discontinuous margin in a continuous metal deposition part is not critical and varies arbitrarily as far as the discontinuous metal deposition part or discontinuous margin can be detected by an appropriate detecting device and the output of the detecting device can operate an appropriate cutting device. Generally, in case of employing a photoelectric device as a detecting device, shapes such as dot, circle, square and rectangle are preferably employed.

Figures 4A, 4B:
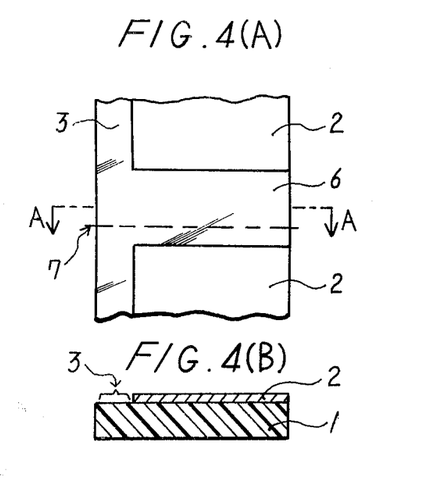

In FIG. 4 (A) and FIG. 4 (B), there is shown an embodiment of the metallized resin film having zonal margin formed in the transverse direction thereof. FIG. 4 (A) is a fragmentary top plan view of the film and FIG. 4 (B) is a transverse sectional view taken along line A-A of FIG. 4 (A). In FIG. 4 (A) and FIG. 4 (B), 1, 2 and 3 are the same as in FIG. 1 (A) and FIG. 1 (B) and 6 are zonal margins in the transverse direction of the film which are aligned in the longitudinal direction of the film with a constant separation. This zonal margin in the transverse direction possesses the same effect with the above-mentioned discontinuous metal deposition part and discontinuous margin and, in addition, possesses a further remarkable effect. That is to say, when the above-mentioned zonal margin in the transverse direction is wide in the longitudinal direction of the film and the metallized resin film is cut within the width of the zonal margin, for instance, at a cutting line 7 as shown in FIG. 4 (A), a part where the metal deposition layer is not present remains at the terminal end of the metallized resin film wound, which makes it unnecessary to add another insulating resin film to the terminal end of the metallized resin film wound in order to prevent short-circuit, that is, terminal treatment which was inevitably necessary in conventional method employing a conventional metallized film as shown in FIG. 1 (A) and FIG. 1 (B) becomes unnecessary. Furthermore, as far as a metallized resin film is cut within the width of the zonal margin in the transverse direction, a metallized resin film having a constant capacity is always obtained with eliminating any scatter in the capacity due to the deviation in the length of a metallized resin film. Accordingly, it is not necessarily required to cut off an exact length of the metallized resin film by means of a close-tolerance cutting device as in case of employing a conventional metallized resin film. Further the cutting operation can be carried out with running a metallized resin film at a higher speed. As a result, the efficiency in the operation of winding the metallized resin film increases remarkably.

The width, in the longitudinal direction of the film, of the zonal margin in the transverse direction is not critical and varies arbitrarily as far as a part where the metal deposition layer is not present remains at the terminal end of the metallized resin film wound when the metallized resin film is cut within the width of the zonal margin. Generally, the width is preferably in a range of 0.5 to 5 c.m.

The self-supporting dielectric resin films employed in the present invention are conventional resin films employed as a dielectric for a condenser. The thickness of the dielectric resin films employed is preferably in a range of about 1.5 to about 25 $\mu$ and more preferably in a range of about 4 to about 12 $\mu$. A dielectric resin film of less than about 1.5 $\mu$ in thickness is not preferable since it is hard to handle in preparing a metallized resin film due to its small self-supportability as well as it is not available commercially. In case of preparing a metallized resin film in which the thickness of a dielectric resin film is less than about 1.5 $\mu$, Process B is superior to Process A. Examples of the dielectric resin films include the films made of polyethylene terephthalate, polyethylene naphthalate, polypropylene, polycarbonate, polystyrene polytetrafluoroethylene, polyamide, polyvinyl chloride or cellulose acetates. Among these films, polyethylene terephthalate, polyethylene naphthalate, polypropylene, polycarbonate and polystyrene are more preferable due to their superior electrical property.

The base films employed in the present invention are not critical so long as they have a sufficient waterproof property and self-supportability. Generally, waterproof resin films of about 4 to 50 $\mu$ in thickness are preferably employed. Examples of the base films include the resin films made of polyethylene, polycarbonate, polytetrafluoroethylene, polyamide, polyvinyl chloride, cellulose acetate, polypropylene, polyethylene terephthalate, polyethylene naphthalate or polystyrene.

The dielectric resins which are employed to give a dielectric resinous coating on the above-mentioned base film are conventional resins suitable for the dielectric of a condenser. Examples of the dielectric resin include thermoplastic resins cellulose derivatives, for instance, ethyl cellulose, cellulose acetate and cellulose acetate butyrate, polycarbonate, polystyrene, saturated polyester resin and acrylic resin, and thermosetting resins such as melamine resin, urea resin, phenolic resin, unsaturated polyester resin, thermosetting-type acrylic resin, alkyd resin, epoxy resin and urethane resin. Among these resins, ethyl cellulose, acrylic resin, urea resin, epoxy resin and urethane resin are preferably employed since they can give a resinous coating having a superior electical property and mechanical strength. These resins may be employed singly or more than two of them may be employed in combination. Usually, these resins are employed in a form of a solution and the solution is applied on a base film per se or on a base film covered with a release layer by a conventional coating method such as silk screen printing, roll printing, gravure printing, reverse roll printing to give a dielectric resinous coating having a desired thickness. The thickness of the dielectric resinous coating is preferably in a range of about 0.5 to about 4 $\mu$ and more preferably in a range of about 2 to about 3 $\mu$. In case the thickness of the dielectric resinous coating is in the above-mentioned range, a resinous coating free from pin-holes can be readily obtained to give a dielectric resinous coating having an extremely stable electric property and the metallized resin film obtained can be readily peeled out of the base film due the high self-supportability of the dielectric resinous coating. In case the thickness of the resinous coating is more than about 4 $\mu$, it is meaningless to employ the dielectric resinous coating having a thickness of more than about 4 $\mu$ prepared by a coating method since a preformed dielectric resin film having such a thickness is commercially available. In case the thickness of dielectric resinous coating is less then about 0.5 $\mu$, there is a great possibility of the formation of pin-holes which damage the electric characteristic as a dielectric and it is difficult to peel off the metallized resin film obtained from the base film and to wind it into a condenser since the metallized resin film obtained has a poor self-supportability due to the fine thickness of the dielectric resinous coating.

The water-soluble paints which are applied on the above-mentioned dielectric resin film (in Process A) and dielectric resinous coating (in Process B) to give a water-soluble coating layer are conventional water-soluble or aqueous paints containing as a main component watersoluble resins such as casein, starch, glue, gelatin, polyvinyl alcohol, polyacrylamide, methyl cellulose, hydroxyethyl cellulose, hydroxymethyl cellulose, polyvinyl pyrrolidone, polyvinyl metyl ether, copolymer of methyl vinyl ether and maleic anhydride, polyacrylic ester, polymethacrylic ester, and carboxymethyl cellulose. Among these water-soluble resins, polyvinyl alcohol, starch, methyl cellulose and carboxymethyl cellulose are preferably employed since they have a high water-solubility and give a paint which have an excellent coating property. The water-soluble paint is applied on a dielectric resin film or a dielectric resinous coating in the portion of the film surface or coating surface corresponding to a desired marginal pattern by a conventional coating method such as silk screen printing, roll printing, gravure printing and reverse roll printing, and dried to give a water-soluble coating layer having a pattern corresponding to that of a margin. The thickness of the water-soluble coating layer is preferably in a range of about 0.5 to about 3 $\mu$ and more preferably in a range of about 1 to about 2 $\mu$ since the water-soluble coating layer having a thickness in the above range is readily dissolved away by washing with water to completely remove the metal deposition layer thereon and thereby the margin edge becomes sharp. In case the thickness of the coating layer is more than about 3 $\mu$, the metal deposition layer on the water-soluble coating layer is removed but the water-soluble coating layer per se can not be completely removed. The remaining water-soluble coating layer causes the blocking of the metallized resin film obtained on storage and reduces the puncture voltage of the metallized resin film. Further, the water-soluble coating layer having a thickness of more than about 3 $\mu$ is not preferable since it generates a great amount of gas during the deposition of metal. In case the thickness of the water-soluble coating layer is less then about 0.5 $\mu$, the metal deposition layer on the water-soluble coating layer is not completely removed to make the practice of the instant process impossible.

Then, metal deposition layer is provided on the dielectric resin film or dielectric resinous coating covered with the water-soluble coating layer having a pattern corresponding to that of a margin. The deposition of metal is carried out according to a conventional vacuum metallizing method. For instance, the pressure in the vacuum chamber is selected from the range of about $1 \times 10^{-2}$ to about $1 \times 10^{-6}$ Torrs and the temperature of evaporation source is selected from the range of about 200° to about 2,000°C, in accordance with a kind of metal. The thickness of the metal deposition is selected from the range of 30 to 100 m$\mu$. The metal deposition layer having a thickness of the above range is suitable for an electrode of condenser element. Examples of the metals to be deposited include zinc, aluminum, copper, silver, gold, tin, and the like. Generally, zinc and aluminum are preferably employed.

Thus obtained integrated film (which consists of dielectric resin film, water-soluble coating layer and metal deposition layer with respect to Process A and base film, dielectric resinous coating, water-soluble coating layer and metal deposition layer with respect to Process B) is washed with water and thereby the water-soluble coating layer and the metal deposition layer thereon are readily eliminated to give a metallized resin film (supported on a base film in Process B) having a desired margin. During washing, the dust attached to the film in the preceding steps is also eliminated to give a clear metallized resin film. The metallized film obtained has a margin of which edge is sharpened and a superior electric property.

According to the process of the present invention, the metallized resin films having various construction can be readily prepared.

The metallized resin film having the construction shown in FIG. 1 (A) and FIG. 1 (B) is the most principal metallized resin film among those employed as a condenser element. Such a metallized resin film is prepared by Process A if it is comparatively thick and by Process B if it is comparatively fine.

Figure 5A:
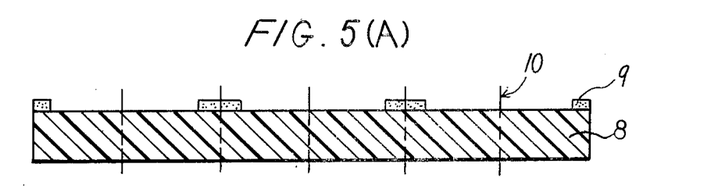
Figure 5B:
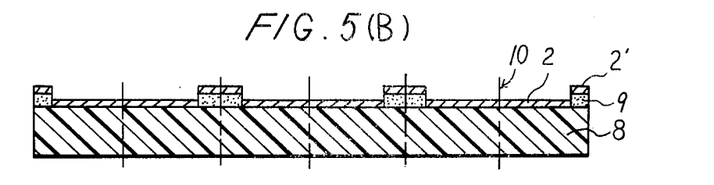
Figure 5C:
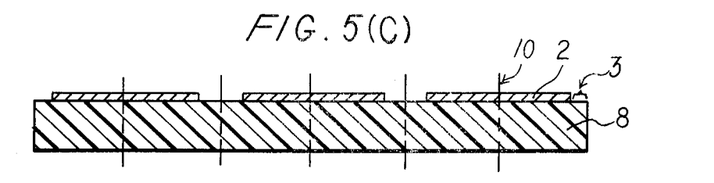
Figure 6A:
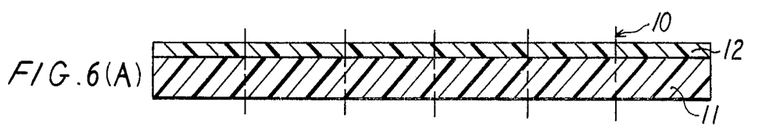
Figure 6B:
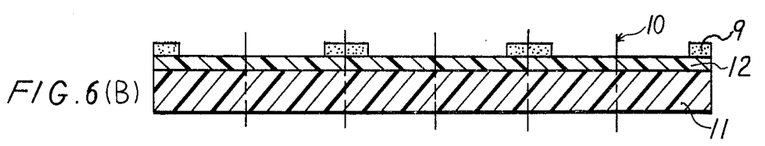
Figure 6C:
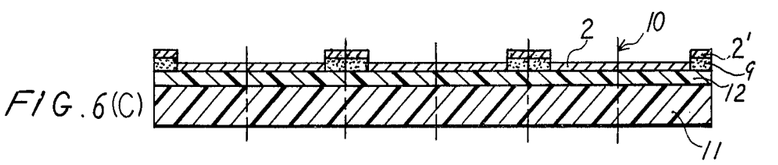
Figure 6D:
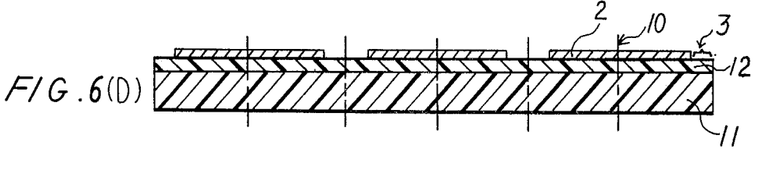
Figure 6E:
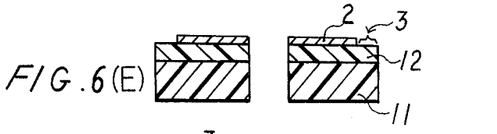

Referring to FIG. 5 (A), FIG. 5 (B) and FIG. 5 (C), there is illustrated an embodiment of the process for preparing the metallized resin film having the construction shown in FIG. 1 (A) and FIG. 1 (B) according to Process A. A water-soluble paint is applied to a preformed dielectric resin film 8 having a thickness of about 1.5 to about 25 $\mu$ in the portion of the film surface corresponding to the marginal pattern and dried to give a water-soluble coating layer 9 having a thickness of about 0.5 to about 3 $\mu$ on the dielectric resin film 8 as shown in a transverse sectional view of FIG. 5 (A). On the partially coated dielectric resin film is deposited a metal to give metal deposition layers 2 and 2' having a thickness of about 30 to about 100 m$\mu$ as shown in a transverse sectional view of FIG. 5 (B). Thus obtained integrated film is washed with water and thereby the water-soluble coating layer 9 and the metal deposition layer 2' thereon are eliminated to give a metallized resin film having a margin 3 as shown in a transverse sectional view of FIG. 5 (C). The metallized resin film obtained is cut at cutting lines 10 in the longitudinal direction thereof by means of a cutting device, for instance, micro-slitter to give metallized resin films for a condenser element as shown in FIG. 1 (A) and FIG. 1 (B).

Referring to FIG. 6 (A), FIG. 6 (B), FIG. 6 (C), FIG. 6 (D) and FIG. 6 (E), there is illustrated an embodiment of the process for preparing the metallized resin film having the construction shown in FIG. 1 (A) and FIG. 1 (B) according to Process B. A solution of a dielectric resin is applied to a base film 11 having a thickness of about 4 to about 50 $\mu$ to give a dielectric resinous coating 12 having a thickness of about 0.5 to about 4 $\mu$ on the base film 11 as shown in a transverse sectional view of FIG. 6 (A). Subsequently, the operations described above in Process A are repeated in the order of steps as shown in FIG. 6 (B) and FIG. 6 (C) to give an integrated film in which a metallized resin film is supported on the base film 11 as shown in a transverse sectional view of FIG. 6 (D). The integrated film obtained is cut at cutting lines 10 in the longitudinal direction thereof into the pieces as shown in a transverse sectional view of FIG. 6 (E). The base film 11 is peeled out of the piece to give a metallized resin film for a condenser element as shown in FIG. 1 (A) and FIG. 1 (B). Otherwise, the metallized resin film is cut after peeled out of the integrated film to give a metallized resin film for a condenser element.

By modifying Process A and Process B mentioned above, the metallized resin films having various constructions as shown in FIG. 7, FIG. 8, FIG. 9 and FIG. 10 are also readily prepared.

Figure 7:
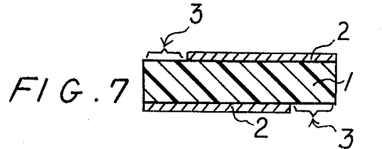
Figure 8:
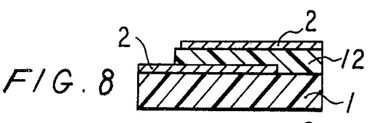
Figure 9:
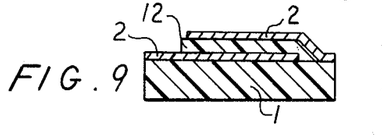
Figure 10:
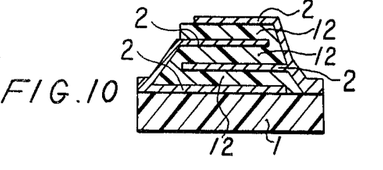
Figure 11A:
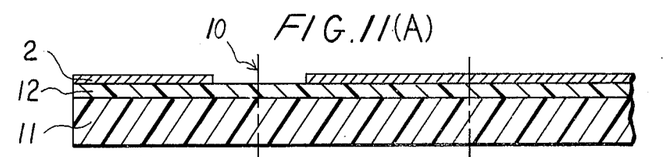
Figure 11B:
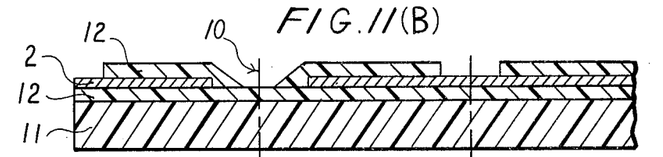
Figure 11C:
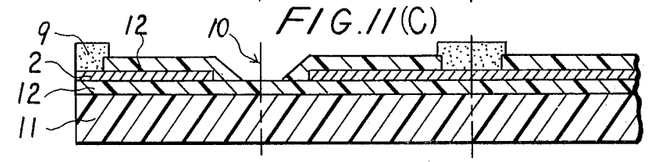
Figure 11D:
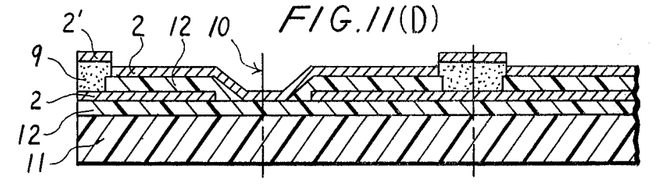
Figure 11E:
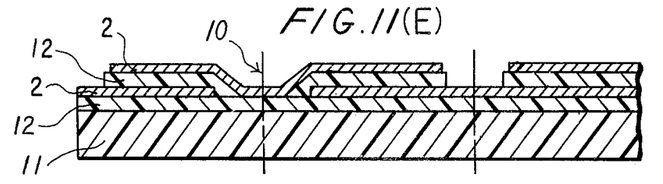
Figure 12A:
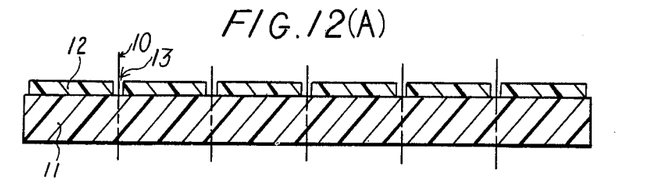
Figure 12B:
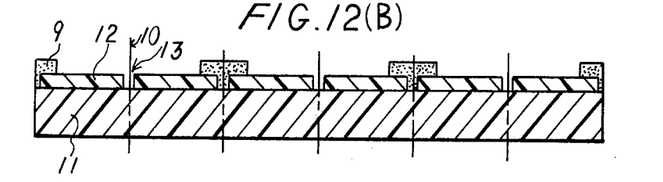
Figure 12C:
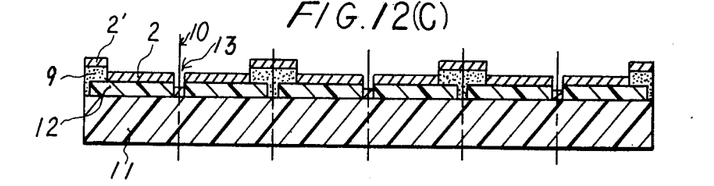
Figure 12D:
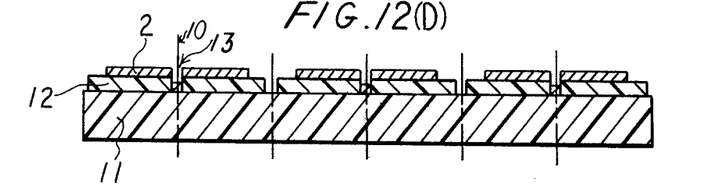
Figure 12E:
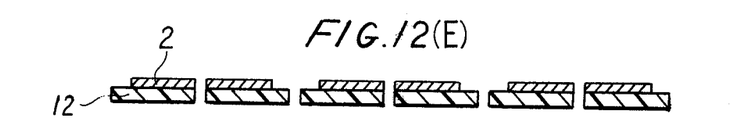

FIG. 7, FIG. 8 and FIG. 9, respectively, show a transverse sectional view of an embodiment of dipolar metallized resin film. FIG. 10 shows a transverse sectional view of an embodiment of dipolar metallized resin film of which each pole is multilayered.

The metallized resin film having the construction as shown in FIG. 8 is prepared, for instance, by a process illustrated in the order of steps in FIG. 11 (A), FIG. 11 (B), FIG. 11 (C), FIG. 11 (D) and FIG. 11 (E). The integrated film shown in FIG. 11 (A) is that produced by the similar manner as in the above-mentioned Process B.

Further, it is possible to make the cutting operation in Process B described above unnecessary by providing a dielectric resinous coating on a base film with remaining a separating part 13 as shown in FIG. 12 (A) and following the successive steps as shown in FIG. 12 (B), FIG. 12 (C), FIG. 12 (D) and FIG. 12 (E).

The metallized resin films having specific marginal patterns as shown in FIG. 2 (A) and FIG. 2 (B), FIG. 3 (A) and FIG. 3 (B), and FIG. 4 (A) and FIG. 4 (B) are readily prepared by applying a water-soluble paint on a dielectric resin film or a dielectric resinous coating in the portion of the film or coating surface corresponding to particular marginal pattern.

The process of the present invention is more particularly described and explained by means of the following illustrative Examples.

EXAMPLE 1

On a polyethylene terephthalate film for an electric purpose having a width of 24 cm. and a thickness of 6 $\mu$ was applied a 20% by weight aqueous solution of polyvinyl alcohol by a gravure printing and dried to give a water-soluble coating layer having a thickness of 2 $\mu$ as shown in FIG. 5 (A).

On the partially coated polyethylene terephthalate film was deposited aluminum under a vacuum of 2 × $10^{-4}$ Torrs at an evaporation temperature of 1,400°C. to give an aluminum deposition layer having a thickness of 70 m$\mu$ as shown in FIG. 5 (B).

Thus obtained integrated film was washed with water and thereby the water-soluble coating layer and the aluminum deposition layer thereon were readily eliminated to give a metallized resin film as shown in FIG. 5 (C).

The metallized resin film obtained was cut at cutting lines 10 of FIG. 5 (C) in the longitudinal direction thereof by a micro-slitter to give a metallized resin film for a condenser element as shown in FIG. 1 (A) and FIG. 1 (B).

In the metallized resin film obtained, the water-soluble coating layer and the aluminum deposition layer thereon was completely eliminated, and the aluminum deposition layer on the polyethylene terephthalate film was tightly fixed thereto without peeling. Further, the metallized resin film had a sharp margin edge and a superior electrical property.

EXAMPLE 2

The experiment of Example 1 was repeated except a 8% by weight aqueous solution of carboxymethyl cellulose was employed instead of the aqueous solution of polyvinyl alcohol.

EXAMPLE 3

The experiment of Example 1 was repeated except a 10% by weight aqueous solution of methyl cellulose was employed instead of the aqueous solution of polyvinyl alcohol.

In Examples 2 and 3, the water-soluble coating layer and the metal deposition layer thereon were also completely eliminated to give a sharp margin edge.

EXAMPLE 4

The experiment of Example 1 was repeated except a polypropylene film having a width of 24 cm. and a thickness of 25 $\mu$ was employed instead of the polyethylene terephthalate film.

The metallized resin film obtained has a sharp margin edge and a superior electrical property.

EXAMPLE 5

The experiment of Example 1 was repeated except the aqueous solution of polyvinyl alcohol was applied on both sides of the polyethylene terephthalate film and aluminum was deposited on the both sides of the partially coated polyethylene terephthalate film. The metallized resin film shown in FIG. 7 was obtained.

EXAMPLE 6

On the whole surface of a polypropylene film for an electric purpose having a width of 24 cm. and a thickness of 30 $\mu$ was applied a solution of 15 parts by weight of ethyl cellulose in 30 parts by weight of methanol and 55 parts of by weight toluene by a gravure printing and dried to give a dielectric resinous coating having a thickness of 1.5 $\mu$ as shown in FIG. 6 (A).

On the dielectric resinous coating was applied a 20% by weight aqueous solution of polyvinyl alcohol by a gravure printing and dried to give a water-soluble coating layer having a thickness of 2 $\mu$ as shown in FIG. 6 (B).

On the partially coated dielectric resinous coating was depositted aluminum under a vacuum of $2 \times 10^{-4}$ Torrs at an evaporation temperature of 1,400°C. to give an aluminum deposition layer having a thickness of 40 m$\mu$ as shown in FIG. 6 (C).

Thus obtained integrated film was washed with water and thereby the water-soluble coating layer and the metal deposition layer thereon were readily eliminated to give a metallized resin film supported on the polypropylene film as shown in FIG. 6 (D).

The metallized resin film supported on the polypropylene film was cut by a micro-slitter at cutting lines 10 shown in FIG. 6 (D) to give the pieces as shown in FIG. 6 (E).

The base film was peeled out of the piece to give a metallized resin film as shown in FIG. 1 (A) and FIG. 1 (B).

Even if the metallized resin film obtained was extremely thin, it was readily prepared since it was being supported by the base film having a sufficient mechanical strength during all operations.

EXAMPLE 7

The experiment of Example 6 was repeated exept a solution of 35 parts by weight of an acrylic resin in 30 parts by weight of toluene, 20 parts by weight of ethyl acetate and 15 parts by weight of methyl ethyl ketone was employed instead of the solution of ethyl cellulose.

EXAMPLE 8

The experiment of Example 6 was repeated except a solution of 25 parts by weight of a precondensate of hexamethylene diisocyanate and glycerol (18 : 7 by weight) in 30 parts by weight of toluene, 20 parts by weight of ethyl acetate and 25 parts by weight of methyl ethyl ketone was employed instead of the solution of ethyl cellulose to give a dielectric resinous coating of an urethane resin.

EXAMPLE 9

The experiment of Example 6 was repeated except the solution of 15 parts of ethyl cellulose in 30 parts by weight of methanol and 55 parts by weight of toluene was applied on the polypropylene film so as to give a dielectric resinous coating having a thickness of 0.75 $\mu$.

Every metallized resin films obtained in Examples 7 to 9 had a sharp margin edge and a superior electrical property.

What we claim is:

1. In a process for producing a metallized resin film for a condenser element comprising at least one dielectric resinous layer and at least one metal deposition layer, the improvement which comprises forming on said resinous layer a margin wherein the metal deposition layer is not present by the steps comprising
   1. providing a water-soluble coating layer by applying a water-soluble paint to at least one side of the dielectric resinous layer in the portion of the resinous layer corresponding to the pattern of margin,
   2. providing a metal deposition layer on the dielectric resinous layer partially coated with the water-soluble coating layer, said metal deposition layer being applied by means of vacuum metallizing procedures, and
   3. removing the water-soluble coating layer and the metal deposition layer thereon by dissolving away the water-soluble coating layer with water.

2. The process of claim 1, wherein the dielectric resinous layer is a self-supporting dielectric resin film.

3. The process of claim 2, wherein the dielectric resin film has a thickness of 1.5 to 25 $\mu$.

4. The process of claim 2, wherein the dielectric resin film is a member selected from the group consisting of the films made of polyethylene terephthalate, polyethylene naphthalate, polypropylene, polycarbonate, polystyrene, polytetrafluoroethylene, polyamide, polyvinyl chloride and cellulose acetate.

5. The process of claim 1, wherein the dielectric resinous layer is a dielectric resinous coating provided on a self-supporting base film by a coating method, said base film is finally removed from the metallized resin film.

6. The process of claim 5, wherein the dielectric resinous coating has a thickness of 0.5 to 4 $\mu$.

7. The process of claim 5, wherein the dielectric resinous coating is made of at least one member selected from the group consisting of ethyl cellulose, cellulose acetate, cellulose acetate butyrate, polycarbonate, polystyrene, saturated polyester resin, acrylic resin, melamine resin, urea resin, phenolic resin, unsaturated polyester resin, thermosetting-type acrylic resin, alkyd resin, epoxy resin and urethane resin.

8. The process of claim 1, wherein the water-soluble paint is an aqueous solution of at least one member selected from the group consisting of casein, starch, glue, gelatin, polyvinyl alcohol, polyacrylamide, methyl cellulose, hydroxyethyl cellulose, hydroxymethyl cellulose, polyvinyl pyrrolidone, polyvinyl methyl ether, carboxymethyl cellulose, copolymer of methyl vinyl ether and maleic anhydride, polyacrylic ester and polymethacrylic ester.

9. The process of claim 1, wherein the water-soluble coating layer is provided on the dielectric resinous layer into a thickness of 0.5 to 3 $\mu$.

10. The process of claim 1, wherein the metal deposition layer is made of a metal selected from the group consisting of aluminum, zinc, copper, silver, gold and tin.

11. The process of claim 1, wherein the margin consists of a zonal margin in the longitudinal direction of the metallized resin film.

12. The process of claim 1, wherein the margin consists of a zonal margin in the longitudinal direction of the metallized resin film, in which discontinuous metal deposition parts are aligned in the longitudinal direction of the zonal margin with a constant separation.

13. The process of claim 12, wherein the separation between adjacent discontinuous metal deposition parts corresponds to the length of a metallized resin film per a piece of condenser.

14. The process of claim 1, wherein the margin consists of a zonal margin in the longitudinal direction of the metallized resin film and discontinuous margins which are aligned in a continuous metal deposition part in the longitudinal direction of the metallized resin film with a constant separation.

15. The process of claim 14, wherein the separation between ajacent discontinuous margins corresponds to the length of a metallized resin film per a piece of condenser.

16. The process of claim 1, wherein the margin consists of a zonal margin in the longitudinal direction of the metallized resin film and zonal margins in the transverse direction of the metallized resin film, which are provided with a constant separation.

17. The process of claim 1, wherein the margin consists of a zonal margin in the longitudinal direction of the metallized resin film, zonal margins in the transverse direction of the metallized resin film and discontinuous metal deposition parts in the zonal margin or discontinuous margins in the continuous metal deposition part.

18. A metallized resin film obtained according to claim 1.

* * * * *